United States Patent
Sudo

(10) Patent No.: US 11,474,346 B2
(45) Date of Patent: Oct. 18, 2022

(54) OPTICAL SCANNING DEVICE

(71) Applicant: Yasuyuki Sudo, Tokyo (JP)

(72) Inventor: Yasuyuki Sudo, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 119 days.

(21) Appl. No.: 16/675,594

(22) Filed: Nov. 6, 2019

(65) Prior Publication Data

US 2020/0201030 A1 Jun. 25, 2020

(30) Foreign Application Priority Data

Dec. 25, 2018 (JP) .............................. JP2018-241506

(51) Int. Cl.
*G02B 26/08* (2006.01)
*G02B 26/10* (2006.01)
*G02B 5/08* (2006.01)

(52) U.S. Cl.
CPC ......... *G02B 26/101* (2013.01); *G02B 26/105* (2013.01); *G02B 5/08* (2013.01)

(58) Field of Classification Search
CPC ...... G02B 26/101; G02B 26/105; G02B 5/08; G02B 26/0858; H01L 41/1132
USPC ...................................................... 359/224.1
See application file for complete search history.

(56) References Cited

U.S. PATENT DOCUMENTS

| 10,242,951 B1* | 3/2019 | Piper ....................... H01L 24/94 |
| 2004/0134979 A1 | 7/2004 | Kudo |
| 2019/0285876 A1* | 9/2019 | Yamada ............... G02B 26/101 |
| 2019/0304920 A1* | 10/2019 | Piper ..................... H01L 23/544 |

FOREIGN PATENT DOCUMENTS

| JP | H04-127551 | 4/1992 |
| JP | H04-171709 | 6/1992 |
| JP | H11-026333 | 1/1999 |
| JP | 2009-217093 | 9/2009 |
| JP | 2011-039227 | 2/2011 |
| JP | 2016-131172 | 7/2016 |

OTHER PUBLICATIONS

Office Action dated Sep. 6, 2022 with respect to the corresponding Japanese patent application No. 2018-241506.

* cited by examiner

*Primary Examiner* — Euncha P Cherry
(74) *Attorney, Agent, or Firm* — IPUSA, PLLC

(57) ABSTRACT

An optical scanning device includes a mirror that includes a mirror reflection surface, a driving part that drives the mirror, and a fixed frame that supports the mirror via the driving part. The fixed frame includes one or more inspection patterns that are formed while at least one of the mirror and the driving part is formed.

13 Claims, 8 Drawing Sheets

OPTICAL SCANNING DEVICE

CROSS-REFERENCE TO RELATED APPLICATION

The present application is based upon and claims priority to Japanese Patent Application No. 2018-241506, filed on Dec. 25, 2018, the entire contents of which are incorporated herein by reference.

BACKGROUND OF THE INVENTION

1. Field of the Invention

An aspect of this disclosure relates to an optical scanning device.

2. Description of the Related Art

There is a known optical scanning device in which sides of a mirror are supported by torsion bars, and the mirror is rotated using the torsion bars as a shaft to deflect and scan incident light. Such an optical scanning device is formed, for example, by processing a silicon-on-insulator (SOI) wafer.

An optical scanning device is generally shaped like a chip and includes a fixed frame that forms the periphery of the optical scanning device. Terminals for electrically connecting the optical scanning device with an external device are provided on the fixed frame (see, for example, Japanese Laid-Open Patent Publication No. 2009-217093).

SUMMARY OF THE INVENTION

In an aspect of this disclosure, there is provided an optical scanning device including a mirror that includes a mirror reflection surface, a driving part that drives the mirror, and a fixed frame that supports the mirror via the driving part. The fixed frame includes one or more inspection patterns that are formed while at least one of the mirror and the driving part is formed.

DESCRIPTION OF THE PREFERRED EMBODIMENTS

As described above, terminals and wires connecting the terminals to other components are provided on portions of a fixed frame of an optical scanning device. However, other portions of the fixed frame merely function as a support and are not fully utilized.

An aspect of this disclosure makes it possible to effectively use the fixed frame without increasing manufacturing costs.

First Embodiment

Figure 1:
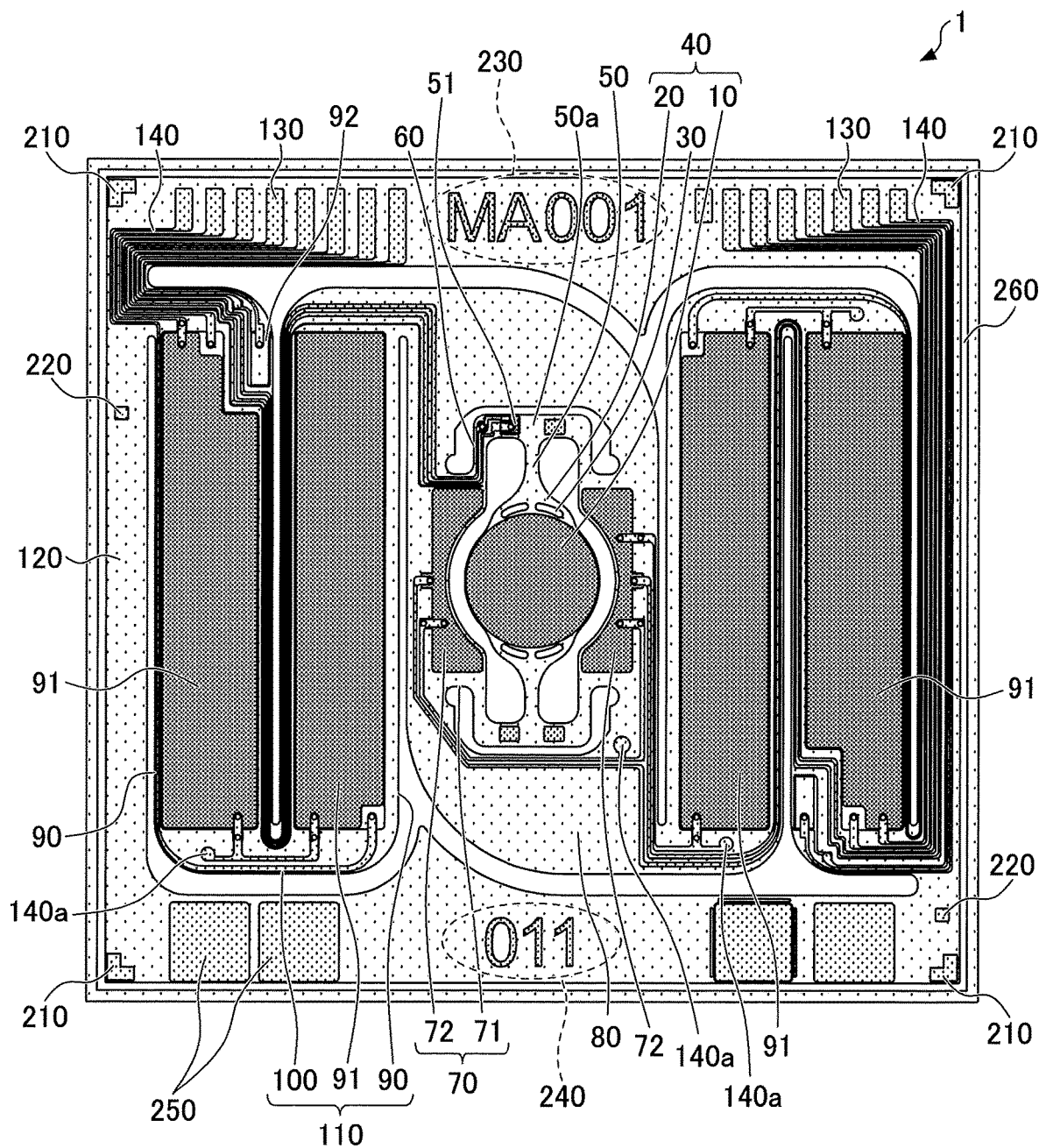
FIG. 1 is a top view of an optical scanning device according to a first embodiment.

A first embodiment is described below with reference to the accompanying drawings. FIG. 1 is a top view of an optical scanning device 1 according to the first embodiment.

As illustrated in FIG. 1, the optical scanning device 1 of the first embodiment is a micro electro mechanical system (MEMS) that includes a mirror 40, torsion bars 50, coupling parts 60, a horizontal driving part 70, a movable frame 80, a vertical driving part 110, a fixed frame 120, terminals 130, and wires 140.

The mirror 40 includes a mirror reflection surface 10 and a stress relaxation region 20. The horizontal driving part 70 includes horizontal driving beams 71 and driving sources 72. The vertical driving part 110 includes vertical driving beams 90, driving sources 91, and coupling parts 100.

The mirror 40 is placed between two torsion bars 50 extending in a vertical direction. Specifically, the outer edges of the mirror 40 in the vertical direction are supported by the torsion bars 50. The mirror 40 includes the mirror reflection surface 10 in the center and the stress relaxation region 20 between the mirror reflection surface 10 and each of the torsion bars 50. Two slits 30 are formed in each stress relaxation region 20. A base end 50a of the torsion bar 50 is connected to the inner corners of the horizontal driving beams 71 via the coupling parts 60. The driving source 72 is disposed on the surface of the horizontal driving beam 71, and the outer side of the horizontal driving beam 71 is connected to the movable frame 80.

The driving source 72 may be implemented by, for example, a piezoelectric element that expands and contracts according to an applied voltage.

A piezoelectric sensor 51 is provided on the base end 50a of the torsion bar 50. The piezoelectric sensor 51 is a tilt angle sensor that detects a horizontal tilt angle of the mirror reflection surface 10 when the mirror 40 is rotating (or oscillating) in the horizontal direction. The piezoelectric sensor 51 may be implemented by, for example, a piezoelectric element.

The movable frame 80 supports the coupling parts 60, the torsion bars 50, and the mirror 40 via the horizontal driving beams 71, and surrounds these components. The movable frame 80 is connected to the vertical driving beams 90 of the vertical driving part 110.

The vertical driving beams 90 are disposed to face the lateral sides of the movable frame 80, i.e., to sandwich the movable frame 80 in the horizontal direction. Multiple vertical driving beams 90 are provided in parallel with the torsion bars 50. On each side of the movable frame 80, two vertical driving beams 90 are disposed adjacent to each other in the horizontal direction. The two adjacent vertical driving beams 90 are connected to each other via the coupling part 100.

One end of the inner vertical driving beam 90 is connected to the movable frame 80, and the other end of the inner vertical driving beam 90 is connected to the outer vertical driving beam 90. One end of the outer vertical driving beam 90 is connected to the fixed frame 120, and the other end of the outer vertical driving beam 90 is connected to the inner vertical driving beam 90. The driving source 91 is provided on the vertical driving beam 90. Similarly to the driving source 72, the driving source 91 is implemented by, for example, a piezoelectric element.

A piezoelectric sensor 92 is provided on an end of the outer vertical driving beam 90. The piezoelectric sensor 92 is a tilt angle sensor that detects a vertical tilt angle of the mirror reflection surface 10 when the mirror 40 is rotating (or oscillating) in the vertical direction. Similarly to the piezoelectric sensor 51, the piezoelectric sensor 92 is implemented by, for example, a piezoelectric element.

The fixed frame 120 supports the vertical driving part 110 via the outer vertical driving beams 90. That is, the fixed frame 120 supports the mirror 40 via the driving parts (the vertical driving part 110 and the horizontal driving part 70). The fixed frame 120 surrounds the vertical driving part 110 and the movable frame 80 and has a rectangular outer shape. In the present embodiment, the fixed frame 120 has a substantially-square outer shape.

Multiple terminals 130 are provided on the upper surface of the fixed frame 120. The wires 140 are connected to the terminals 130. The wires 140 are connected to the driving sources 72 and 91 and the piezoelectric sensors 51 and 92. Substrate contact parts 140a are formed on the wires 140. The wires 140 contact a silicon active layer 303, which is a substrate to which a ground potential is applied, via the substrate contact parts 140a.

Next, the components of the optical scanning device 1 are described in more detail.

The mirror 40 includes a substantially-circular mirror reflection surface 10 in the center. The mirror reflection surface 10 is formed of a film of a highly-reflective metal such as silver, copper, or aluminum.

The stress relaxation region 20 is a spacer provided between the torsion bar 50 and the mirror reflection surface 10 to relax the torsional stress of the torsion bar 50 and reduce the stress applied to the mirror reflection surface 10. The stress relaxation region 20 can disperse the stress generated by the torsional motion of the torsion bar 50 and relax the stress applied to the mirror reflection surface 10.

The slits 30 are formed in the stress relaxation region 20 to disperse the stress applied to the stress relaxation region 20.

The torsion bars 50 support the outer edges of the mirror 40 and cause the mirror 40 to rotate (or oscillate) in the horizontal direction. Here, the horizontal direction indicates a direction in which light reflected by the mirror reflection surface 10 is scanned at high speed, i.e., the lateral direction of a projection surface. That is, the horizontal direction is a direction in which the mirror reflection surface 10 is rotated laterally around the torsion bars 50. The torsion bars 50 are twisted alternately left and right and cause the mirror 40 to rotate (or oscillate) in the horizontal direction.

The coupling parts 60 transmit the horizontal driving force generated at the horizontal driving beams 71 to the torsion bars 50.

The horizontal driving beams 71 cause the mirror 40 to rotate (or oscillate) in the horizontal direction and thereby cause light reflected by the mirror reflection surface 10 to scan a projection surface in the horizontal direction. The two horizontal driving beams 71 are caused to warp alternately in opposite directions by applying voltages with different phases to the two driving sources 72. As a result, a torsional force is applied to the torsion bars 50, and the mirror 40 is rotated about a horizontal-rotation axis that is parallel to the torsion bars 50.

For example, the horizontal driving beams 71 drive the mirror 40 by resonant driving. When, for example, the optical scanning device 1 of the present embodiment is applied to a projector, the mirror 40 is driven by 30-kHz resonant driving.

Also, the movable frame 80 can be rotated (or caused to oscillate) in the vertical direction by applying voltages with different phases to adjacent vertical driving beams 90. Because the mirror 40 is supported by the movable frame 80, the mirror 40 rotates (or oscillates) in the vertical direction along with the rotation (or oscillation) of the movable frame 80.

For example, the vertical driving part 110 rotates the movable frame 80 by nonresonant driving. Compared with horizontal driving, vertical driving does not require high-speed driving, and the drive frequency of vertical driving is, for example, about 60 Hz.

The optical scanning device 1 with the above-described configuration is manufactured using, for example, an SOI wafer.

Figure 2:
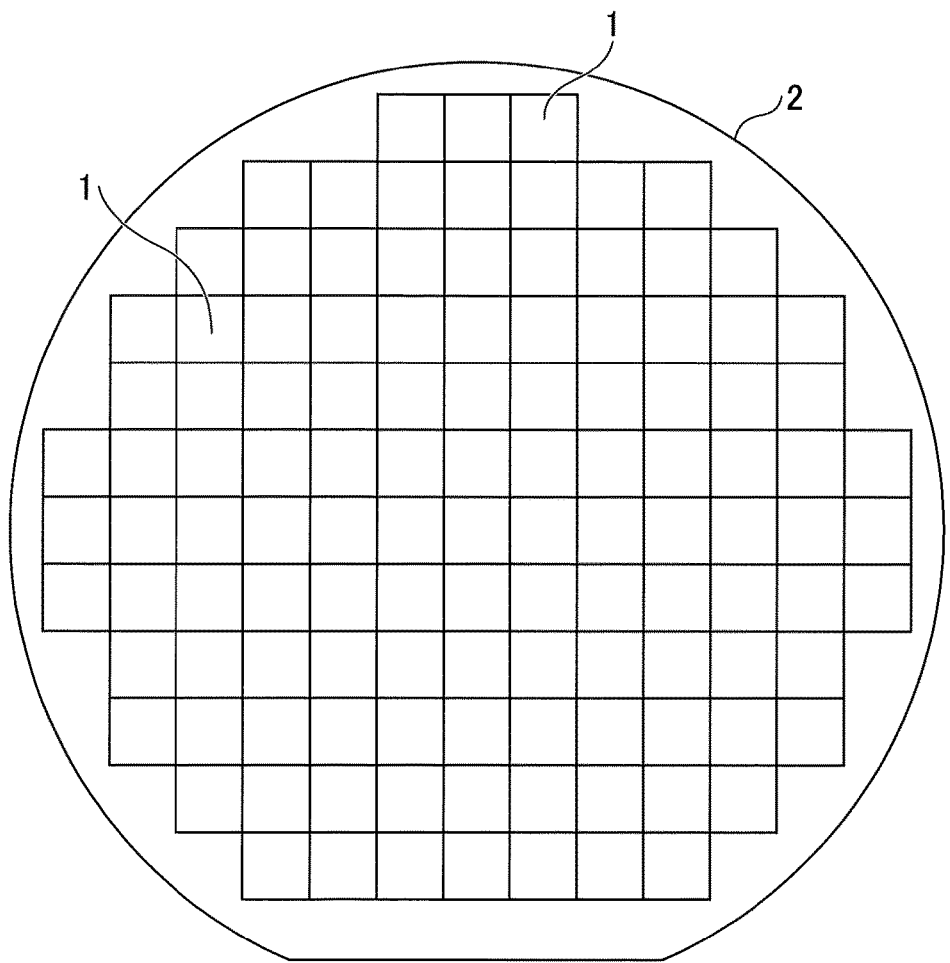
FIG. 2 is a drawing illustrating a wafer where multiple optical scanning devices are formed.

FIG. 2 illustrates a wafer 2 where multiple optical scanning devices 1 are formed. The optical scanning devices 1 are formed in a matrix on the wafer 2 by using a wafer processing technology. The optical scanning devices 1 are formed on the wafer 2, inspected while they are on the wafer 2, and then diced into chips. Various inspections are also performed on the optical scanning devices 1 in the form of chips, and the optical scanning devices 1 are mounted on, for example, circuit boards.

Referring back to FIG. 1, inspection patterns are formed on the surface of the fixed frame 120 in addition to the terminals 130 and the wires 140. The inspection patterns include first recognition patterns 210, second recognition patterns 220, a first identification pattern 230, a second identification pattern 240, a first management pattern 250, and a second management pattern 260.

These inspection patterns are formed in a manufacturing process for forming, for example, the mirror 40, the horizontal driving part 70, and the vertical driving part 110.

The first recognition patterns 210 are markers used by an appearance inspection device to recognize an inspection area of each optical scanning device 1 in an appearance inspection of the optical scanning device 1 in the form of a wafer or a chip. The first recognition patterns 210 are positioned at four corners of the fixed frame 120.

The appearance inspection device identifies the inspection area in an image captured by a camera based on the first recognition patterns 210 and detects an appearance defect in the identified inspection area. An appearance defect may be formed during a process of forming the optical scanning devices 1 on the wafer 2 or during a dicing process.

The second recognition patterns 220 are markers used by a chip sorter to recognize the position of each of the optical scanning devices 1 diced into chips. The chip sorter identifies the position of each optical scanning device 1 obtained by dicing the wafer 2 based on the second recognition patterns 220 in an image captured by a camera, holds the optical scanning device 1 by suction, and transfers the optical scanning device 1 to, for example, a chip tray.

The first identification pattern 230 is information for identifying a product type of the optical scanning device 1. In the present embodiment, the first identification pattern 230 is character information representing a model number of a product. For example, when analyzing an optical scanning device 1 returned from a customer due to a defect, the first identification pattern 230 makes it easier to identify the product type of the optical scanning device 1.

The second identification pattern 240 is information indicating the position (or address) of each optical scanning device 1 in the wafer 2. In the present embodiment, the second identification pattern 240 is character information representing an address in the wafer 2. The second identification pattern 240 makes it possible to determine whether there are correlations between the results of various inspections such as the appearance inspection and the defect analysis and the positions of the optical scanning devices 1 in the wafer 2. This in turn makes it easier to determine whether the cause of a defect is in the wafer processing and if the cause is in the wafer processing, makes it easier to identify a manufacturing process causing the defect.

The first management pattern 250 is used to manage the accuracy of etching performed by an etching device used to manufacture the optical scanning device 1. For example, etching accuracy such as the depth of etching performed to form a contact hole or an opening can be managed by observing the first management pattern 250 after the optical scanning device 1 is manufactured.

The second management pattern 260 is used to manage the accuracy of dicing performed by a dicing device used to manufacture the optical scanning device 1. The second management pattern 260 is formed along the outer edge of the optical scanning device 1. The dicing accuracy can be managed by observing the second management pattern 260 on the optical scanning device 1 in the form of a chip and measuring the distance between the outer edge of the optical scanning device 1 and the second management pattern 260.

Next, configurations of the inspection patterns are described in more detail.

Figure 3:
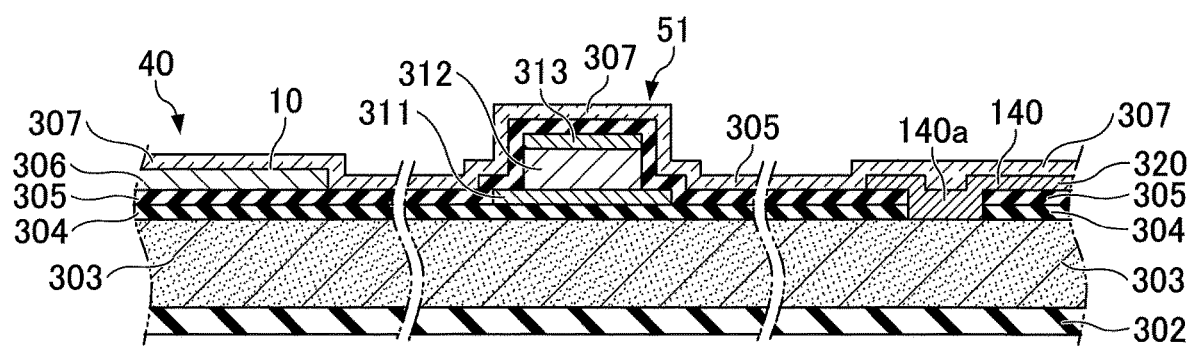
FIG. 3 is a cross-sectional view of a portion of an optical scanning device including a mirror, a piezoelectric sensor, and a substrate contact part.

First, a cross-sectional structure of the optical scanning device 1 is described. FIG. 3 is a cross-sectional view of a portion of the optical scanning device 1 including the mirror 40, the piezoelectric sensor 51, and the substrate contact part 140a. As illustrated in FIG. 3, the optical scanning device 1 is formed by using an SOI substrate 300. The SOI substrate 300 includes a support substrate 301 formed of silicon (Si), a buried oxide (BOX) layer 302, and a silicon active layer 303 that are stacked in this order (see FIG. 4). The BOX layer 302 is an oxide insulating film formed of silicon dioxide ($SiO_2$). The silicon active layer 303 is formed of single-crystal silicon.

In regions other than the mirror 40, the fixed frame 120, and the movable frame 80, the support substrate 301 is removed by etching to provide resilience. The support substrate 301 is left in the fixed frame 120 and the movable frame 80.

In the region where the mirror 40 is formed, a surface oxide film 304 is formed on the silicon active layer 303. The surface oxide film 304 is a silicon thermal oxide film ($SiO_2$) formed on the surface of the silicon active layer 303 by performing a thermal oxidation treatment on the silicon active layer 203.

An interlayer insulating film 305 is formed on the surface oxide film 304. The interlayer insulating film 305 is formed of, for example, alumina ($Al_2O_3$). A metal film 306 is formed on the interlayer insulating film 305 to form the mirror reflection surface 10. The metal film 306 is formed of, for example, a silver (Ag) alloy. The interlayer insulating film 305 adhere well to the metal film 306. The metal film 306 is formed on the interlayer insulating film 305 by, for example, sputtering.

A reflectance increasing film 307 is formed on the metal film 306 that functions as the mirror reflection surface 10. The reflectance increasing film 307 is a multilayer dielectric film formed by stacking dielectric films with different refractive indices. The laminated dielectric film functions as a reflectance increasing film that increases the reflectance of light in a low wavelength region (a region lower than a wavelength of 550 nm) in the visible light region. The reflectance increasing film 307 is a multilayer dielectric film formed by stacking a high-refractive-index film formed of, for example, titanium oxide on a low-refractive-index film formed of, for example, alumina. The difference in refractive index between the low-refractive-index film and the high-refractive-index film is preferably large.

In the region where the piezoelectric sensor 51 is formed, the surface oxide film 304 is formed on the silicon active layer 303. A lower electrode 311, a piezoelectric body 312, and an upper electrode 313 are stacked on the surface oxide film 304 in this order. The driving source 72 is comprised of the lower electrode 311, the piezoelectric body 312, and the upper electrode 313.

The lower electrode 311 and the upper electrode 313 are formed of, for example, platinum (Pt). The piezoelectric body 312 is a lead zirconate titanate (PZT) thin film. The interlayer insulating film 305 is formed on the upper electrode 313. The reflectance increasing film 307 is formed on the interlayer insulating film 305. Each of the piezoelectric sensor 92 and the driving sources 72 and 91 has a configuration that is substantially the same as the configuration of the piezoelectric sensor 51.

In the region where the substrate contact part 140a is formed, the surface oxide film 304 is formed on the silicon active layer 303, and the interlayer insulating film 305 is formed on the surface oxide film 304. A contact hole, which reaches the silicon active layer 303 used as a substrate, is formed through the interlayer insulating film 305 and the surface oxide film 304, and a conductive layer 320 is formed to fill the contact hole. A portion of the conductive layer 320 filling the contact hole forms the substrate contact part 140a. Also, the wires 140 are formed by etching and patterning the conductive layer 320. The conductive layer 320 is formed of, for example, gold (Au).

Figure 4:
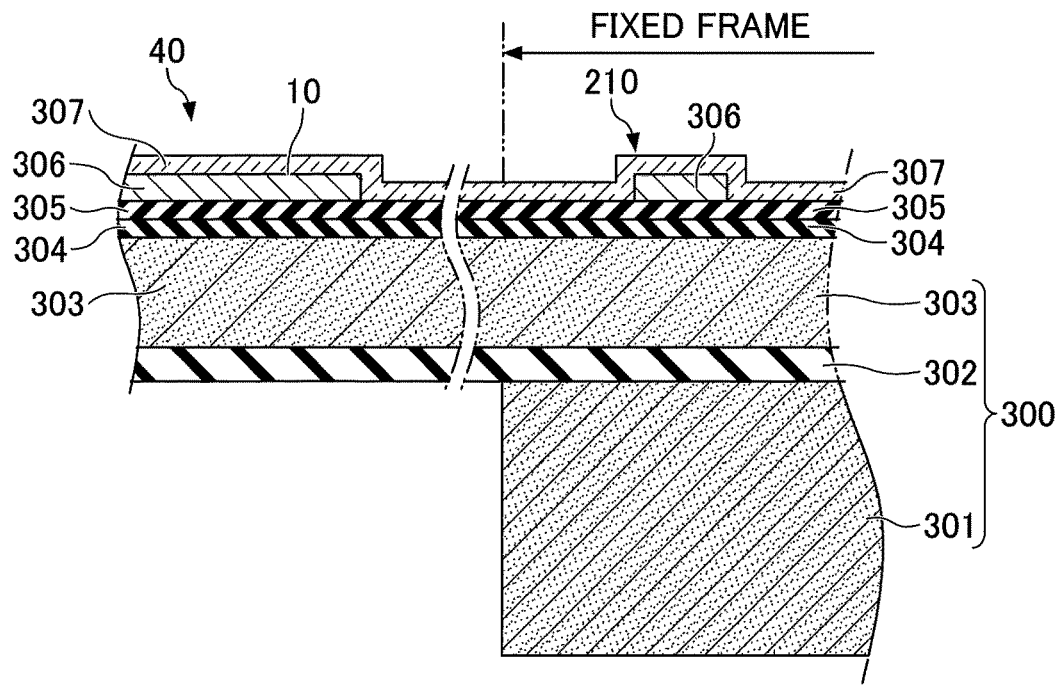
FIG. 4 is a drawing illustrating cross-sectional structures of regions where a first recognition pattern on a fixed frame and a mirror are formed.

FIG. 4 is a drawing illustrating cross-sectional structures of regions where the first recognition pattern 210 on the fixed frame 120 and the mirror 40 are formed.

As illustrated in FIG. 4, the fixed frame 120 is formed using the support substrate 301 as a base. The surface oxide film 304 and the interlayer insulating film 305 are stacked on the silicon active layer 303. The first recognition pattern 210 is formed by patterning the metal film 306 formed on the interlayer insulating film 305 to form the mirror reflection surface 10 at the same time when the mirror reflection surface 10 is formed. The reflectance increasing film 307 is formed on the first recognition pattern 210.

Because the optical scanning device 1 is formed of special films such as an alumina film and a titanium oxide film, the entire chip of the optical scanning device 1 has complex colors. However, the recognition accuracy of the optical scanning device 1 or the first recognition pattern 210 is improved by forming the first recognition pattern 210 with the metal film 306 having a high optical reflectance.

Figure 5:
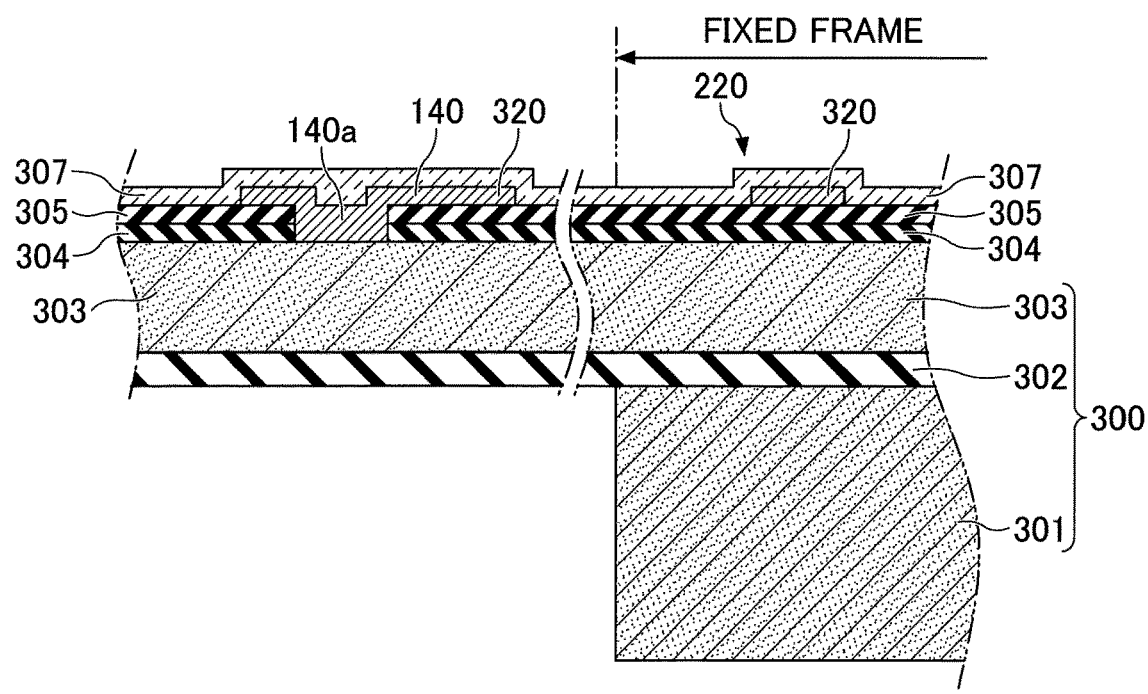
FIG. 5 is a drawing illustrating cross-sectional structures of regions where second recognition patterns on a fixed frame and a substrate contact part are formed.

FIG. 5 is a drawing illustrating cross-sectional structures of regions where the second recognition pattern 220 on the fixed frame 120 and the substrate contact part 140a are formed.

As illustrated in FIG. 5, the second recognition pattern 220 is formed by the conductive layer 320 on the interlayer insulating film 305. The second recognition pattern 220 is formed by patterning the conductive layer 320 formed on the interlayer insulating film 305 to form the wires 140 at the same time when the wires 140 are formed. The reflectance increasing film 307 is formed on the second recognition pattern 220.

The recognition accuracy of the second recognition pattern 220 is improved by forming the second recognition pattern 220 with the conductive layer 320 having a high optical reflectance.

Figure 6:
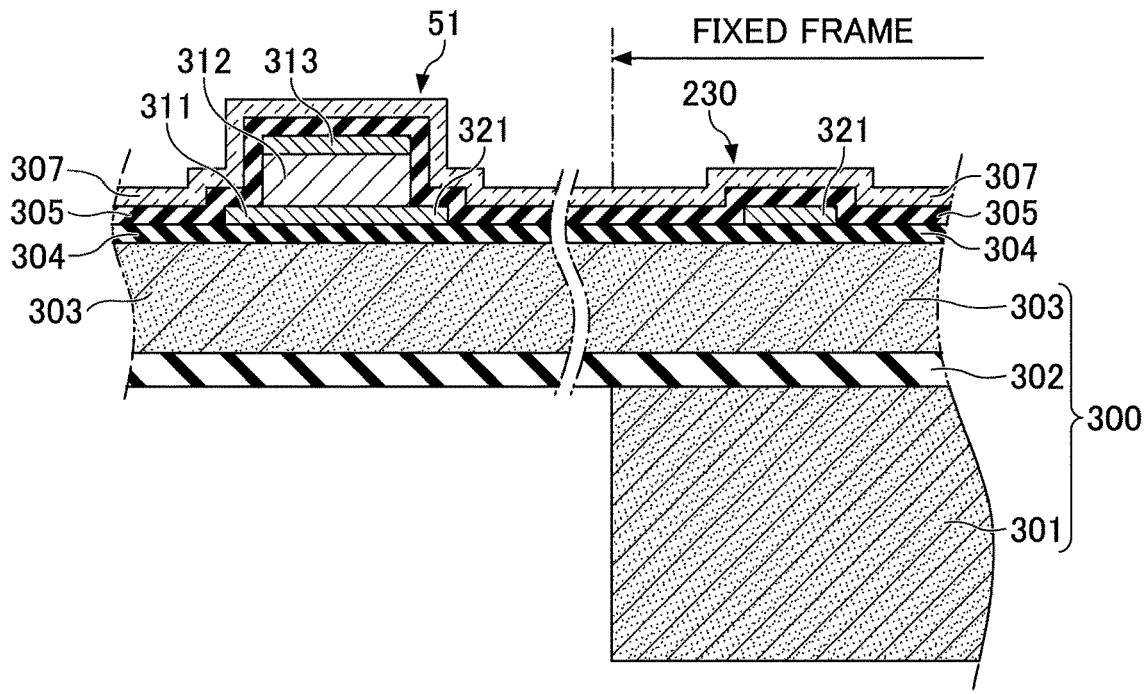
FIG. 6 is a drawing illustrating cross-sectional structures of regions where a first identification pattern on a fixed frame and a piezoelectric sensor are formed.

FIG. 6 is a drawing illustrating cross-sectional structures of regions where the first identification pattern 230 on the fixed frame 120 and the piezoelectric sensor 51 are formed.

As illustrated in FIG. 6, the first identification pattern 230 is formed by a metal layer 321 on the surface oxide film 304. The first identification pattern 230 is formed by patterning the metal layer 321 formed on the surface oxide film 304 to form the lower electrode 311 of the piezoelectric sensor at the same time when the lower electrode 311 is formed.

Also, the lower electrodes of the piezoelectric sensor 92 and the driving sources 72 and 91 are formed by patterning the metal layer 321 at the same time when the first identification pattern 230 is formed. The second identification pattern 240 is also formed of the metal layer 321. The second identification pattern 240 is also formed by patterning the metal layer 321 at the same time when the first identification pattern 230 is formed.

The recognition accuracy of the first identification pattern 230 and the second identification pattern 240 is improved by forming the first identification pattern 230 and the second identification pattern 240 with the metal layer 321 having a high optical reflectance.

Figure 7:
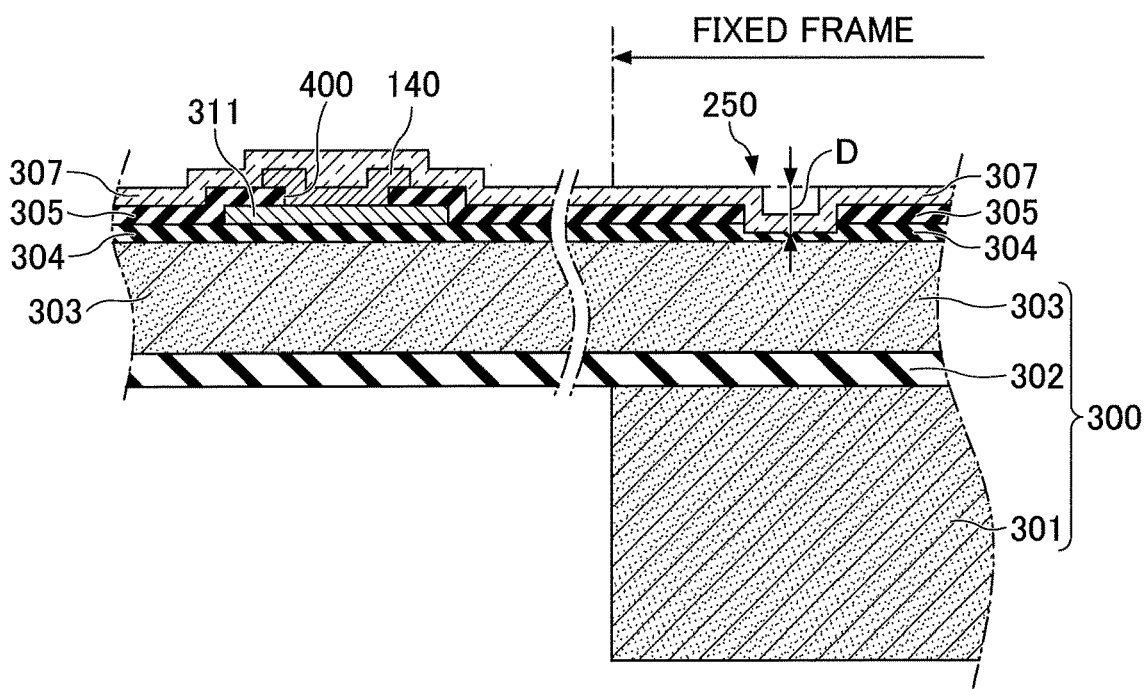
FIG. 7 is a drawing illustrating cross-sectional structures of regions where a first management pattern on a fixed frame and a contact hole are formed.

FIG. 7 is a drawing illustrating cross-sectional structures of regions where the first management pattern 250 on the fixed frame 120 and the contact hole 400 are formed.

The contact hole 400 is, for example, an etched hole formed in the interlayer insulating film 305 to connect the wire 140 to the lower electrode 311.

The first management pattern 250 is an etched hole formed in the surface oxide film 304 and the interlayer insulating film 305 stacked on the silicon active layer 303. The first management pattern 250 is formed at the same time when the contact hole 400 is formed in an etching process for forming the contact hole 400.

In the etching process for forming the contact hole 400, the lower electrode 311 functions as an etching stopper. On the other hand, there is no film that functions as an etching stopper for the first management pattern 250. Therefore, a depth D of the first management pattern 250 is different from the depth of the contact hole 400.

If the depth of the contact hole 400 is insufficient, contact failure occurs between the wire 140 and the lower electrode 311. Whether the etching has reached a depth that is sufficient to exceed the thickness of the interlayer insulating film 305 can be confirmed by measuring the depth D of the first management pattern 250 and obtaining a difference between the thickness of the interlayer insulating film 305 and the measured depth D.

Figure 8:
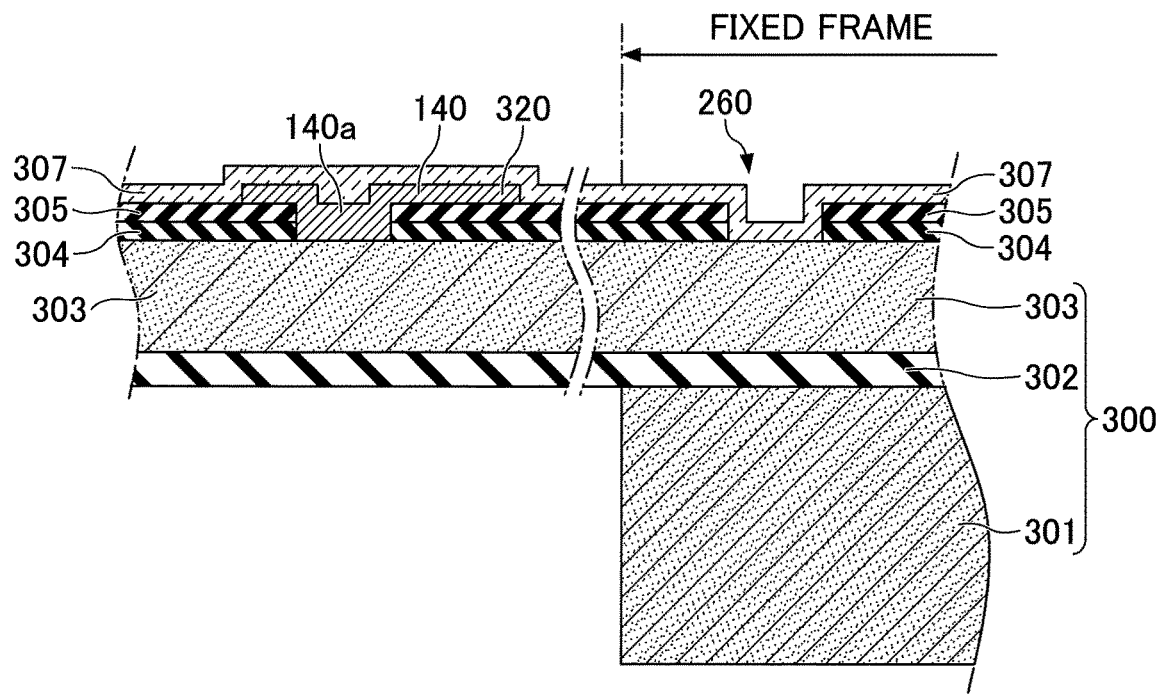
FIG. 8 is a drawing illustrating cross-sectional structures of regions where a second management pattern on a fixed frame and a substrate contact part are formed.

FIG. 8 is a drawing illustrating cross-sectional structures of regions where the second management pattern 260 on the fixed frame 120 and the substrate contact part 140a are formed.

The second management pattern 260 is an etched hole formed in the surface oxide film 304 and the interlayer insulating film 305 stacked on the silicon active layer 303. In other words, the second management pattern 260 is an etched groove that is formed at the same time when the substrate contact part 140a is formed in an etching process for forming the substrate contact part 140a.

As described above, in the optical scanning device 1 of the present embodiment, various inspection patterns are formed on the fixed frame 120. Because the inspection patterns are formed at the same time when elements of the optical scanning device 1 are formed, forming the inspection patterns does not increase the manufacturing costs.

Among the inspection patterns, the management patterns may be formed in scribe lines between chip forming regions. However, when the management patterns are formed in the scribe lines, the width of the scribe lines increases, and the number of optical scanning devices 1 that can be manufactured with one wafer 2 decreases. Accordingly, it is not preferable to form the management patterns in the scribe lines.

Thus, the first embodiment makes it possible to effectively use a fixed frame without increasing manufacturing costs.

Variations

Next, variations of the first embodiment are described. In the first embodiment, the first recognition pattern 210, the second recognition pattern 220, the first identification pattern 230, the second identification pattern 240, the first management pattern 250, and the second management pattern 260 are formed as inspection patters on the fixed frame 120. However, other patterns may also be formed on the fixed frame 120.

For example, other patterns include a positioning pattern (alignment mark) for positioning a photomask, an electrical characteristic evaluation pattern (TEG: test element group), and a cross-section evaluation pattern.

Figure 9:
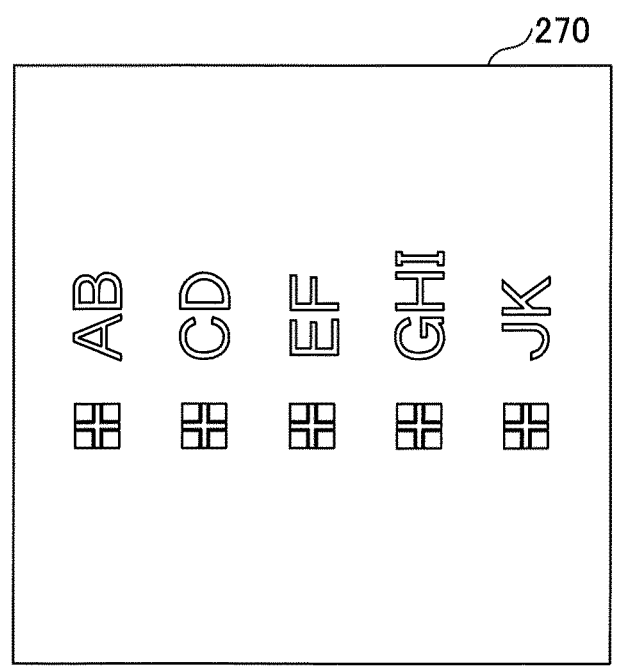
FIG. 9 is a drawing illustrating a positioning pattern.

FIG. 9 is a drawing illustrating a positioning pattern 270. The positioning pattern 270 illustrated in FIG. 9 is formed by patterning various layers formed during the wafer processing. The positioning pattern 270 is used to align a photomask.

Figure 10:
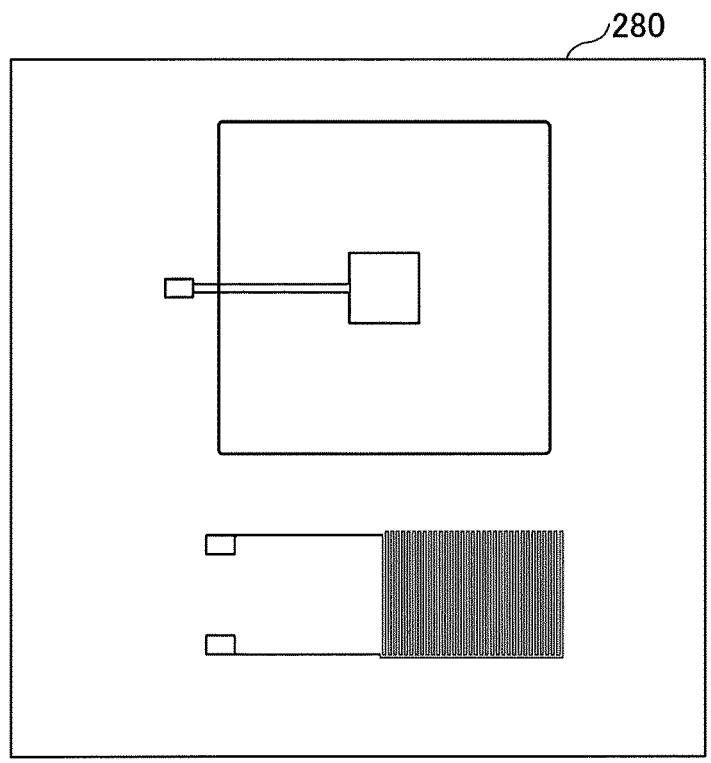
FIG. 10 is a drawing illustrating an electrical characteristic evaluation pattern.

FIG. 10 is a drawing illustrating an electrical characteristic evaluation pattern 280. The electrical characteristic evaluation pattern 280 illustrated in FIG. 10 is formed by patterning various layers formed during the wafer processing. The electrical characteristic evaluation pattern 280 is used to evaluate various electrical characteristics for detecting problems in processes and designs.

Figure 11:
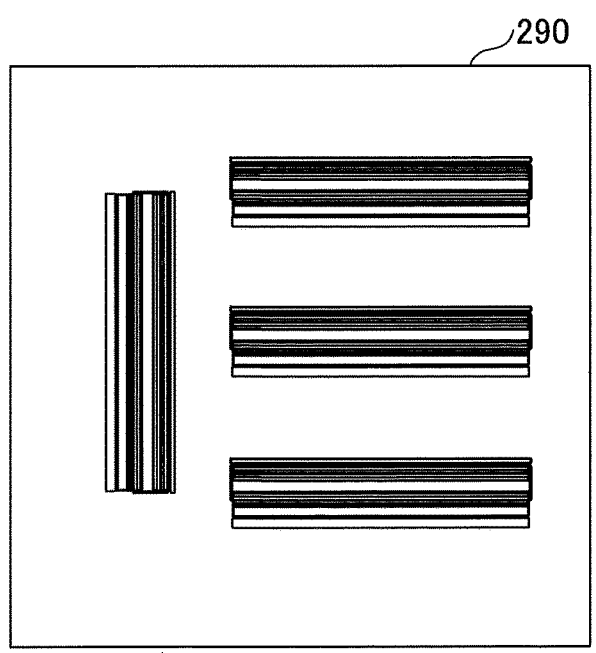
FIG. 11 is a drawing illustrating a cross-section evaluation pattern.

FIG. 11 is a drawing illustrating a cross-section evaluation pattern 290. The cross-section evaluation pattern 290 illustrated in FIG. 11 is formed by patterning various layers formed during the wafer processing. The cross-section evaluation pattern 290 is used to evaluate the quality of a cross-sectional shape of the optical scanning device 1. For example, the shapes of layers are evaluated by observing a cross section that is exposed by cleaving the optical scanning device 1, which is separated by dicing, along a region where the cross-section evaluation pattern 290 is formed.

Figure 12:
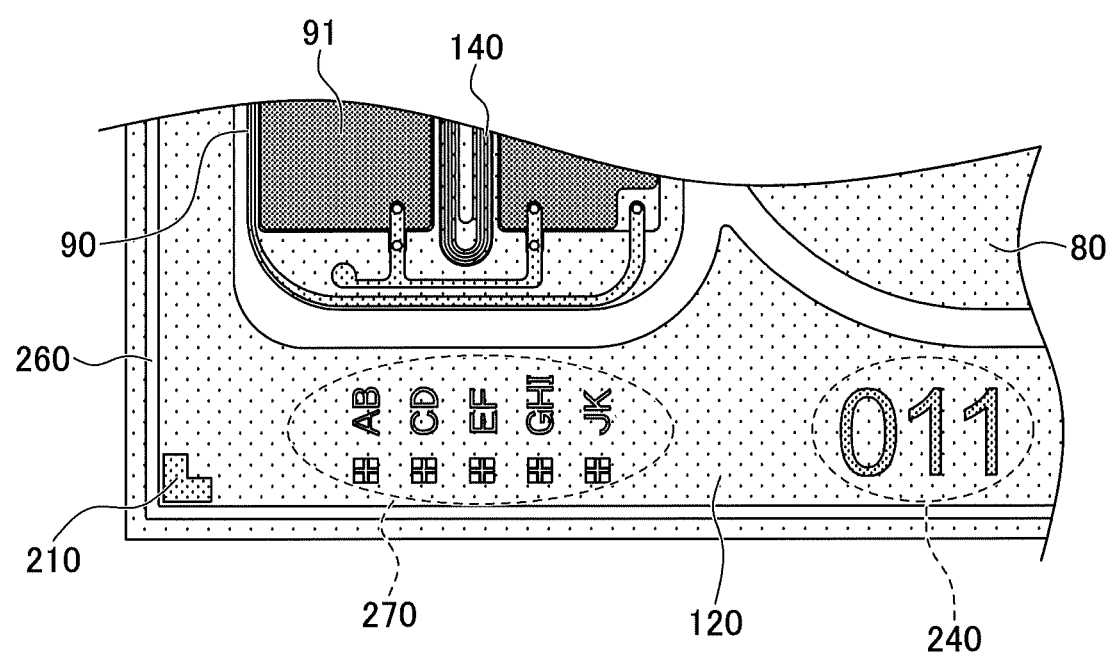
FIG. 12 is a drawing illustrating an example where a positioning pattern is formed on a fixed frame.

FIG. 12 is a drawing illustrating an example where the positioning pattern 270 is formed on the fixed frame 120.

The positioning pattern 270 may also be formed in any position other than the position illustrated in FIG. 12.

Also, the positioning pattern 270, the electrical characteristic evaluation pattern 280, and the cross-section evaluation pattern 290 may be formed in a dummy chip that is not formed as the optical scanning device 1 in the wafer 2.

Figure 13:
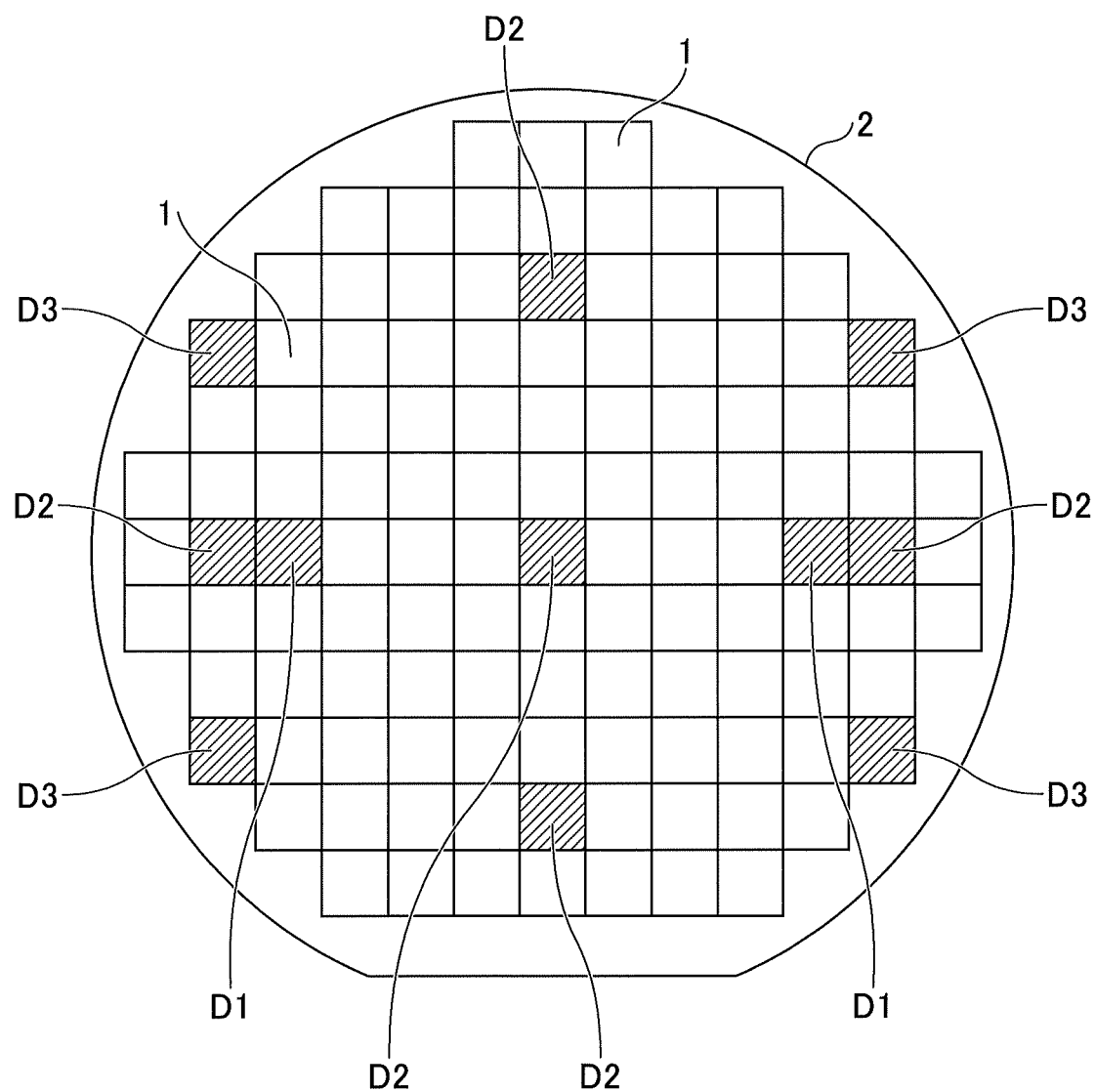
FIG. 13 is a drawing illustrating an example of an arrangement of dummy chips in a wafer.

FIG. 13 is a drawing illustrating an example of an arrangement of dummy chips in the wafer 2. For example, the positioning pattern 270 is formed in dummy chips D1 disposed in positions that are horizontally symmetric with respect to the center of the wafer 2. The electrical characteristic evaluation pattern 280 is formed, for example, in dummy chips D2 disposed in the center of the wafer 2 and in positions that are vertically and horizontally symmetric with respect to the center of the wafer 2. The cross-section evaluation pattern 290 is formed, for example, in dummy chips D3 that are disposed at the corners.

The optical scanning device 1 of the above-described embodiment can be applied to a two-dimensional optical scanning device such as an eyewear or a projector.

In the above embodiment, the present invention is described using an optical scanning device including torsion bars as an example. However, the present invention is also applicable to an optical scanning device that does not include torsion bars. Also in the above embodiment, the present invention is described using a two-dimensional optical scanning device as an example. However, the present invention is also applicable to a one-dimensional optical scanning device in which a mirror is rotated in one direction.

An optical scanning device according to the embodiment of the present invention is described above. However, the present invention is not limited to the specifically disclosed embodiment, and variations and modifications may be made without departing from the scope of the present invention.

What is claimed is:

1. An optical scanning device, comprising:
a mirror that includes a mirror reflection surface, the mirror including a plurality of laminated first films;
a driving part configured to drive the mirror, the drive part including a plurality of laminated second films; and
a fixed frame that supports the mirror via the driving part,
wherein the fixed frame includes a region portion, the region portion including at least one inspection pattern of (i) a first inspection pattern that is formed to include at least one first film of the plurality of laminated first films or (ii) a second inspection pattern that is formed to include at least one second film of the plurality of laminated second films,
wherein the first inspection pattern is located on a same tier as a first metal layer that forms the mirror reflection surface, the first inspection pattern including a same material as the first metal layer, and
wherein the second inspection pattern is located on a same tier as a second metal layer that is included in the driving part, the second inspection pattern including a same material as the second metal layer.

2. The optical scanning device as claimed in claim 1, wherein the at least one inspection pattern includes a first recognition pattern that is used by an appearance inspection device to recognize an inspection area of the optical scanning device.

3. The optical scanning device as claimed in claim 2, wherein the first recognition pattern is formed of the first metal layer that forms the mirror reflection surface.

4. The optical scanning device as claimed in claim 1, wherein the at least one inspection pattern includes a second recognition pattern that is used by a chip sorter to recognize a position of the optical scanning device.

5. The optical scanning device as claimed in claim 4, wherein the second recognition pattern is formed of a conductive layer that forms a wire connected to the driving part.

6. The optical scanning device as claimed in claim 1, wherein the at least one inspection pattern includes a first identification pattern that indicates a product type of the optical scanning device.

7. The optical scanning device as claimed in claim 6, wherein the first identification pattern is formed of the second metal layer that forms a lower electrode of a piezoelectric element constituting a part of the driving part.

8. The optical scanning device as claimed in claim 1, wherein the at least one inspection pattern includes a second identification pattern that indicates an address of the optical scanning device in a wafer.

9. The optical scanning device as claimed in claim 8, wherein the second identification pattern is formed of the second metal layer that forms a lower electrode of a piezoelectric element constituting a part of the driving part.

10. The optical scanning device as claimed in claim 1, wherein the at least one inspection pattern includes a first management pattern that is used to manage accuracy of etching performed by an etching device.

11. The optical scanning device as claimed in claim 10, wherein the first management pattern is an etched hole formed by the etching.

12. The optical scanning device as claimed in claim 1, wherein the at least one inspection pattern includes a second management pattern that is used to manage accuracy of dicing performed by a dicing device.

13. The optical scanning device as claimed in claim 12, wherein the second management pattern is an etched groove that is formed by an etching process for forming a substrate contact in the driving part.

* * * * *